United States Patent [19]

MacCormack et al.

[11] Patent Number: 5,430,748
[45] Date of Patent: Jul. 4, 1995

[54] LASER SYSTEM WITH PHASE-CONJUGATOR-ENHANCED OUTPUT

[76] Inventors: Stuart MacCormack, 2615 Second St., No. 3, Santa Monica, Calif. 90405; Jack L. Feinberg, 725 33rd St., Manhattan Beach, Calif. 90266

[21] Appl. No.: 184,676

[22] Filed: Jan. 21, 1994

[51] Int. Cl.[6] ............................................. H01S 3/13
[52] U.S. Cl. ..................................... 372/29; 372/106
[58] Field of Search ........................... 372/29, 44, 106

[56] References Cited

U.S. PATENT DOCUMENTS

| | | | |
|---|---|---|---|
| 4,656,641 | 4/1987 | Scifres et al. | 372/103 |
| 4,686,485 | 8/1987 | Goldberg et al. | 330/4.3 |
| 5,033,054 | 8/1990 | Scifres et al. | 372/50 |

OTHER PUBLICATIONS

MacCormack et al; "Near-Diffraction-Limited Single-Lobe Emission . . . " Optics Letters; vol. 16, No. 10, May 1991, pp. 705–707.
"High-brightness output from a laser–diode array coupled to a phase-conjugating mirror," MacCormack and Feinberg, Optics Letters vol. 18 No. 1, Feb. 1, 1993.
Abbas, Yang, Chan, and Fujimoto, "Injection behavior of high-power broad-area diode lasers," Optics Letters vol. 12 No. 8, Jan. 1987, pp. 605–607.
Adachihara, Hess, Indik, and Moloney, "Semiconductor laser array dynamics: numerical simulations on multistripe index-guided lasers," J. Opt. Soc. Am., vol. 10 No. 3, Mar. 1993.
Chun, Goldberg, and Weller, "Injection-beam parameter optimization of an injection-locked diode-laser array," Optics Letters vol. 14 No. 5, Mar. 1, 1989.
D'Amato, Siebert, and Roychoudhuri, "Coherent operation of an array of diode lasers using a spatial filter in a Talbot cavity," Appl. Phys. Lett., vol. 55 No. 9, Aug. 1989, pp. 816–818.
Ewbank, "Mechanism for photorefractive phase conjugation using incoherent beams," Optics Letters vol. 13 No. 1, Jan. 1988.
Feinberg, "Self-pumped, continuous-wave phase conjugator using internal reflection," Optics Letters, vol. 7 No. 10, Oct. 1982, pp. 486–488.
Fischer and Sternklar, "Self Bragg matched beam steering usign the double color pumped photorefractive oscillator," Appl. Phys. Lett., vol. 51, No. 2, Jul. 13, 1987.
Goldberg and Chun, "Injection locking characteristics of a 1 W broad stripe laser diode," Appl. Phys. Lett., vol. 53, No. 20, Nov. 14, 1988, pp. 1900–1902.
Goldberg, Taylor, Weller, and Scifres, "Injection locking of coupled-stripe diode laser arrays," Appl. Phys. lett., vol. 46, No. 3, Feb. 1, 1985.
Hadley, Hohimer, and Owyoung, "Free-running modes for gain-guided diode laser arrays," IEEE Journal of Quantum Electronics, vol. 26, No. 2, Feb. 1990, pp. 270–279.
Leger, Scott, and Veldkamp, "Coherent addition of AlGaAs lasers using microlenses and diffractive coupling," Appl. Phys. Lett., vol. 50 No. 21, May 25, 1987, pp. 1465–1467.
MacCormack and Eason, "Near-diffraction-limited single-lobe emission from a high-power diode-laser

(List continued on next page.)

Primary Examiner—Rodney B. Bovernick
Assistant Examiner—Robert E. Wise

[57] ABSTRACT

A laser system includes a linear array of broad area lasers. Such a laser source produces a beam that has a polarization axis in the direction in which the array extends and a coherency axis orthogonal to that. The laser is injection locked by phase conjugating a portion of the array's light output. The phase conjugator has a conjugation axis. The coherency axis is aligned with this conjugation axis. External cavity optics include a polarization rotator to align the polarization axis with the coherency axis before the beam reaches the phase conjugator. Thus, the polarization, coherency, and conjugation axes are all aligned, optimizing the action of the phase conjugator. The approach works in both a single-beam and a dual-beam phase conjugation mode. The result is a laser system output of higher intensity, greater coherence, and a narrower frequency range.

19 Claims, 10 Drawing Sheets

OTHER PUBLICATIONS array coupled to a photorefractive self-pumped phase-conjugate mirror," *Optics Letters*, vol. 16, No. 10, May 15, 1991, pp. 705-707.

Ross and Eason, "Double phase-conjugate mirror with sixfold gain in photorefractive $BaTiO_3$, at near-infrared wavelengths," *Optics Letters* vol. 18 No. 8, Apr. 15, 1993, pp. 371-373.

Segev, Weiss, and Fischer, "Coupling of diode laser arrays with photorefractive passive phase conjugate mirrors," *Appl. Phys. Lett.*, vol. 50, No. 20, May 18, 1987, 1397-1399.

Verdiell and Frey, "A broad-area mode-coupling model for multiple-stripe semiconductor lasers," *IEEE Journal of Quantum Electronics*, vol. QE-23, No. 6, Jun. 1987, pp. 765-774.

LASER SYSTEM WITH PHASE-CONJUGATOR-ENHANCED OUTPUT

BACKGROUND OF THE INVENTION

The present invention relates to optics and, more particularly, to lasers. A major objective of the present invention is to provide low divergence output from a linear array of semiconductor lasers.

Lasers are a well-known source of coherent light. This coherency allows the laser light to be readily controlled, directed and concentrated. In addition, laser output tends to be limited to certain resonance modes; thus, laser light is often highly monochromatic. Accordingly, lasers serve in many applications as high-intensity precision light sources, as high intensity precision heat sources, and as signal carriers. Semiconductor lasers promise these capabilities in an inexpensive, compact, and rugged format. In fact, semiconductor lasers are the prime candidate for signal generators in the heavily promoted vision of an information superhighway.

Single-mode semiconductor lasers can provide coherent light. However, such lasers tend to provide only milliwatts of optical output. There are two basic approaches to increasing the optical power obtainable from semiconductor lasers: 1) develop more powerful semiconductor lasers, and 2) combine semiconductor elements in an array.

Taking advantage of both of these approaches, high-power "broad-area" semiconductor lasers have been arranged in linear arrays. The term "broad-area lasers" encompasses any laser that can support multiple spatial modes. Broad-area lasers can themselves be laser arrays, so herein the arrays they are incorporated into are referred to as "super arrays", and the output of a super array is herein referred to as a "super beam". The super beam is constituted by the beams from individual broad-area lasers. Each broad area laser can have a spatially periodically varying gain to exclude certain undesirable operating modes. The periodicity establishes discrete high-gain regions so that the broad area output beam is constituted by a linear series of subbeams.

The problem with these broad-area arrays and arryas is the lack of coherence among the beams and among the subbeams. This lack of coherence decreases the spectral purity, the controllability, and the general usefulness of the output for traditional laser applications. Several approaches to improving the coherency among the several subbeams of a broad area laser have met with at least limited success.

For example, light can be fed into the back face of a broad area laser by an external mirror, thus defining an external cavity. If the mirror is on-axis, then a spatial filter (an aperture) can be placed in the external cavity to prevent certain transverse modes from resonating, thus forcing the laser to operate in its fundamental, in-phase transverse mode. A disadvantage of this approach is that much of the available power is lost due to the filtering, and that there is no separate output beam. One can also feed light into the back face of a broad-area laser, but then it becomes more difficult to cool the laser because optical access is then needed to both the front and back laser faces.

Alternatively, a mirror can be arranged off-axis to feedback a portion of the output back into the front face of the laser. This arrangement can enhance the operation of a high order transverse mode. However, this arrangement is very sensitive to mirror misalignment, for example, due to mechanical vibrations and temperatures changes.

The alignment problem can be addressed by using a phase-conjugator instead of a mirror. While a mirror only returns a normal incident beam back to its source, a phase conjugator returns incident light arriving from any of a wide range of angles back to its source. A phase conjugator can adjust to small changes in alignment in real time so that laser operation is not disturbed by vibrations and temperature changes. However, the lack of coherency from a broad area laser makes it difficult to initiate phase conjugation. S. MacCormack and R. W. Eason, Opt. Lett. 16, 705 (1991) addresses this problem using a separate single-mode laser to drive the broad area laser. The broad area laser's subbeams are all locked to the single-mode laser, providing the coherency necessary to initiate phase conjugation. There is an alignment issue in directing the single-mode laser's output into the broad area laser, but this is much less critical that the alignment of a feedback mirror. However, the requirement of the additional laser adds to the cost and complexity of the laser system.

It should be noted that none of these methods works very well when extended to the super array of broad area lasers. In part, this is because any required laser and/or mirror alignment must be relative to many lasers at once. What is needed is a laser system that can take advantage of the power available from a super array of broad beam lasers and yet emit a laser beam that has the qualities of extreme directionality and coherence that make lasers so useful. Moreover, it is desirable that such a system does not require an external laser to drive the main output lasers.

SUMMARY OF THE INVENTION

The present invention includes a laser source, a phase conjugator and external cavity optics. The invention applies: where 1) the laser source has a linear polarization axis and a coherency axis that forms a discrepancy minor angle of at least 45° therebetween; and 2) the phase conjugator has a unique conjugation axis. In this case, the invention provides that the optics be arranged so that a portion of the laser output is directed to the phase conjugator with its coherency axis substantially aligned with the conjugation axis of the phase conjugator. The invention further provides that the polarization axis can be rotated relative to the coherency axis so that it is also substantially aligned with the conjugation axis.

An exemplary laser source meeting the above requirements is a linear array of semiconductor lasers arranged with their common polarization along the length of the array. An exemplary phase conjugator is or includes a barium titanate ($BaTiO_3$) crystal, the c axis of which is the conjugation axis. The external cavity optics can include a half-wave plate to implement the required polarization rotation. In addition, the optics can include a cylindrical lens to narrow the beam cross section in the plane; defined by the propagation vector of the laser beam and its coherency axis. The output beam for the system can optionally propagate through one or both of the polarization rotator or the cylindrical lens.

A polarization axis is the direction in which a light beam is linearly polarized. A coherency axis is the direction of maximal coherence for a light beam. Both of these axes are taken normal to the propagation vector associated with the beam. By "conjugation axis" is meant the axis along which the phase-conjugator lacks inversion symmetry. This means that the conjugation axis is directional and affects affects light differently depending on whether the light is traveling along or against the conjugation axis. When incoming parallel beams are spaced in the direction of the conjugation axis, more crosstalk is induced between them than when such beams are spaced normal to the conjugation axis. In the case of barium titanate, the c axis is the conjugation axis.

A beam axis, e.g., a polarization or coherency axis, is "aligned" with a conjugation axis if the beam axis lies in the plane formed by the conjugation axis and the beam propagation vector. The angle through which a beam axis would have to be rotated to provide for this alignment is a measure of misalignment. "Substantial alignment" herein means that misalignment is not greater than 20°.

The invention provides for both single-beam and dual-beam phase conjugation. Single-beam embodiments provide the advantage of enhanced laser output without the need of an auxiliary laser. Dual-beam embodiments provide the advantage of injection locking a high power laser using a low power, single-mode laser. In the latter case, the amplitude and frequency of the high power laser can be controlled by the lower power laser. These and other features and advantages of the present invention are apparent from the description below with reference to the following drawings.

DESCRIPTION OF THE PREFERRED EMBODIMENTS

Figure 1:
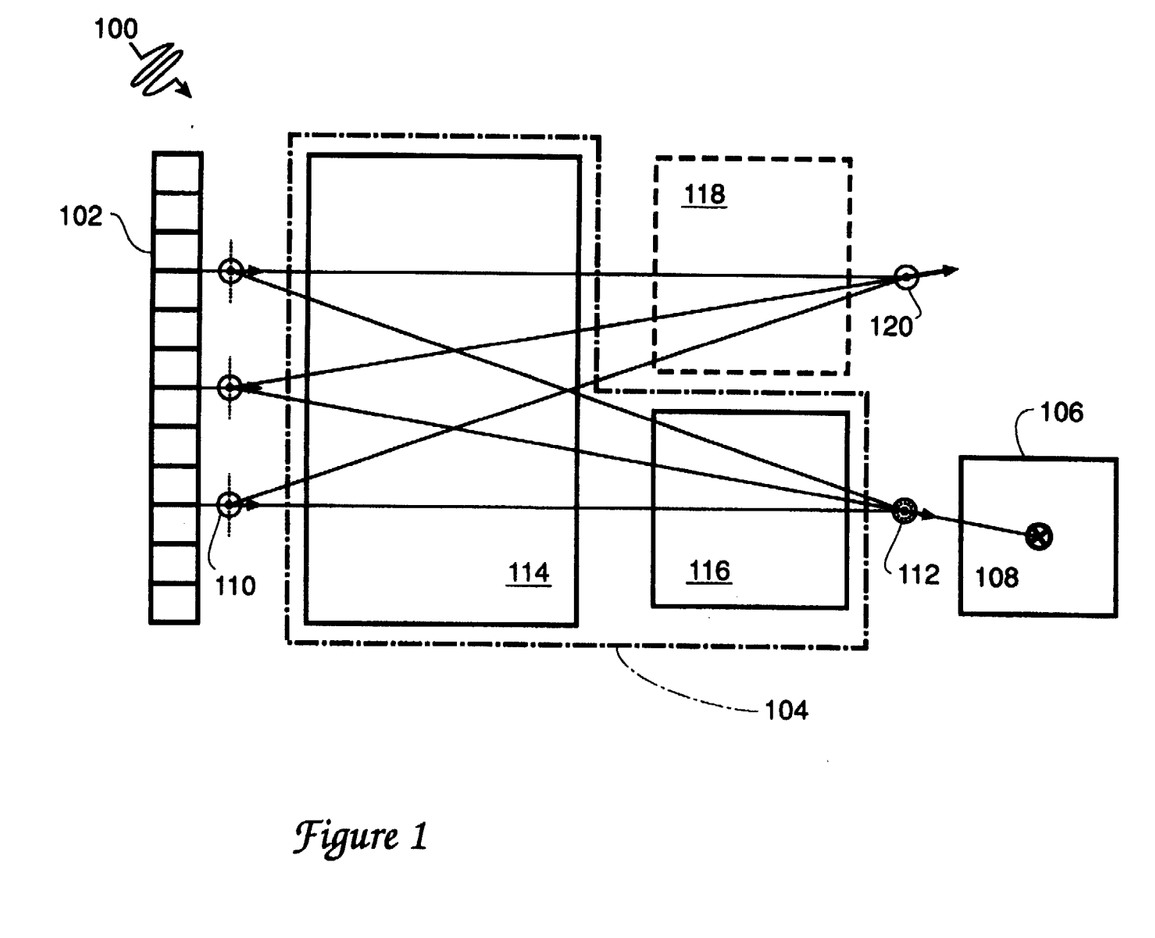
FIG. 1 is a schematic view of a laser system layout in accordance with the present invention.

A laser system 100 in accordance with the present invention is shown in FIG. 1 having a laser source 102, external cavity optics 104, and a phase conjugator 106. Phase conjugator 106 has a conjugator axis 108, shown directed into the page of FIG. 1. Laser source 102 provides an output beam that has linear polarization and asymmetrical coherency. The axis of maximal coherency is orthogonal to the axis of linear polarization, and both of these axes are orthogonal to the propagation vector of the beam. This relationship is indicated by beam descriptor 110, in which the arrow is the propagation vector, the dotted line is the polarization axis, and the circle indicates the coherency axis which is directed normal to the page of FIG. 1.

Optics 104 serve to align the coherency axis with the conjugation axis of phase conjugator 106. This function is represented by beam descriptor 112, in which the solid circle indicates the coherency axis is oriented normal to the page of FIG. 1. Optics 104 can also serve to rotate the polarization axis relative to the coherency axis so that the polarization axis is also aligned with the conjugation axis upon incidence. For simplicity, FIG. 1 is drawn everywhere normal to the coherency axis, even though optical elements can cause the coherency axis to rotate in physical space.

Optics 104 include common optics 114 that are shared by light directed to phase conjugator 106 and light output from the laser system, and injector optics 116 that affect light directed to and from phase conjugator 106, but not light output from laser system 100. Provision can be made for optics 118 dedicated to the output beam, but these are not considered part of laser system 100.

The optical element rotating polarization can alternatively be in common optics 114 or injector optics 116. Where the rotation is performed by injector optics 116, the output beam's polarization is not rotated relative to the coherency axis. Where the rotation is performed by the common optics, the polarization axis of the output beam is aligned with its coherency axis. Since it is indeterminate in FIG. 1, polarization is not indicated in output beam indicator 120.

Figures 2A, 2B:
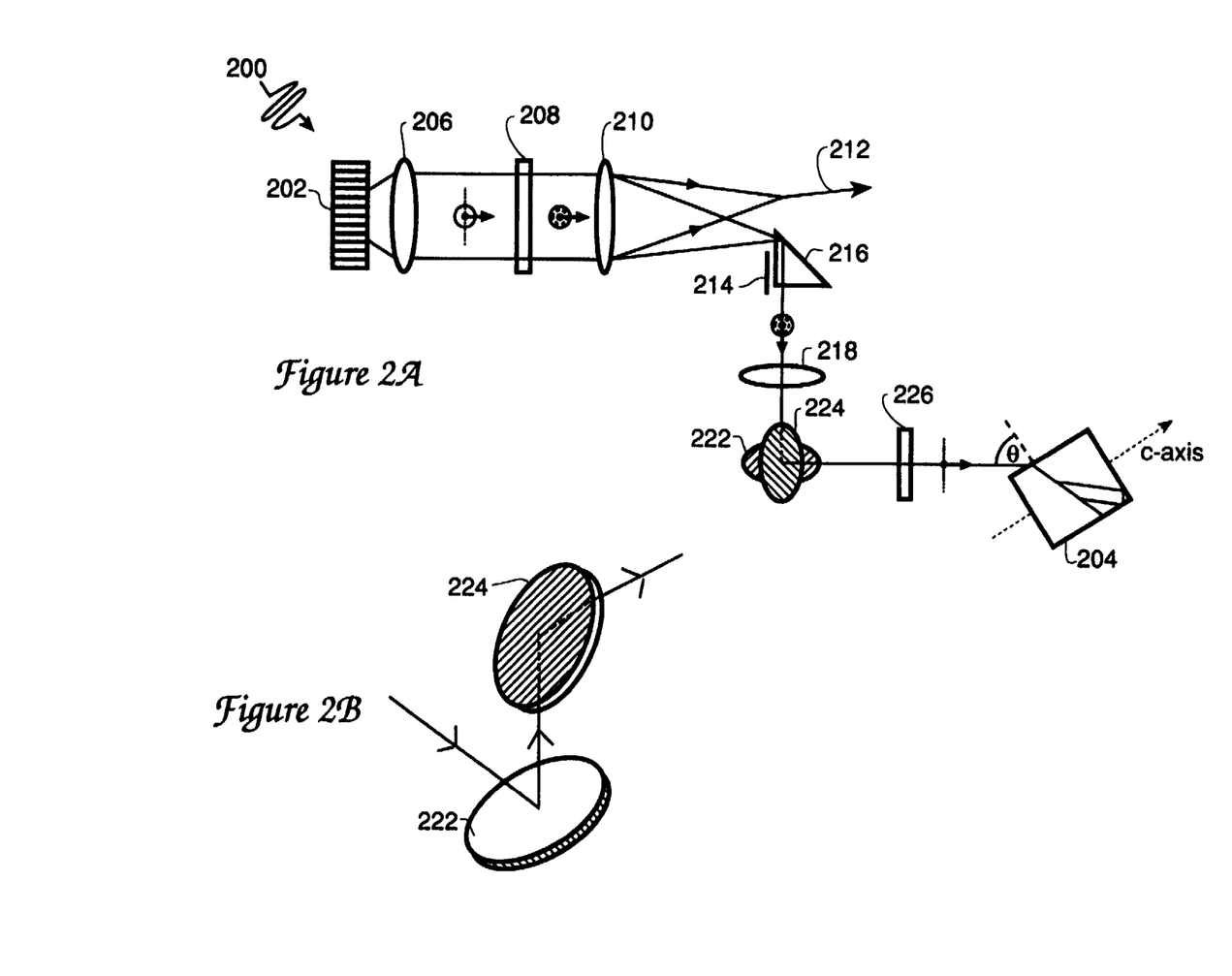
FIG. 2A is a schematic view of a single-beam phase conjugating laser system in accordance with the present invention.
FIG. 2B is a detail of a mirror assembly of the system of FIG. 2A.

A laser system 200 in accordance with the present invention includes a super array 202 of broad area lasers, and a phase-conjugating crystal 204 of barium titanate. The common cavity optics includes a collimating lens 206, a half-wave plate 208 serving as the polarization rotator, and a focusing lens 210 for focusing a lobe of the laser beam into the injector optics, while a complementary lobe serves as the output 212 of laser system 200. Injector optics of system 200 include a spatial filter 214, a prism 216, a convergence lens 218, a pair of mirrors 222 and 224, and a cylindrical lens 226.

Figure 3:
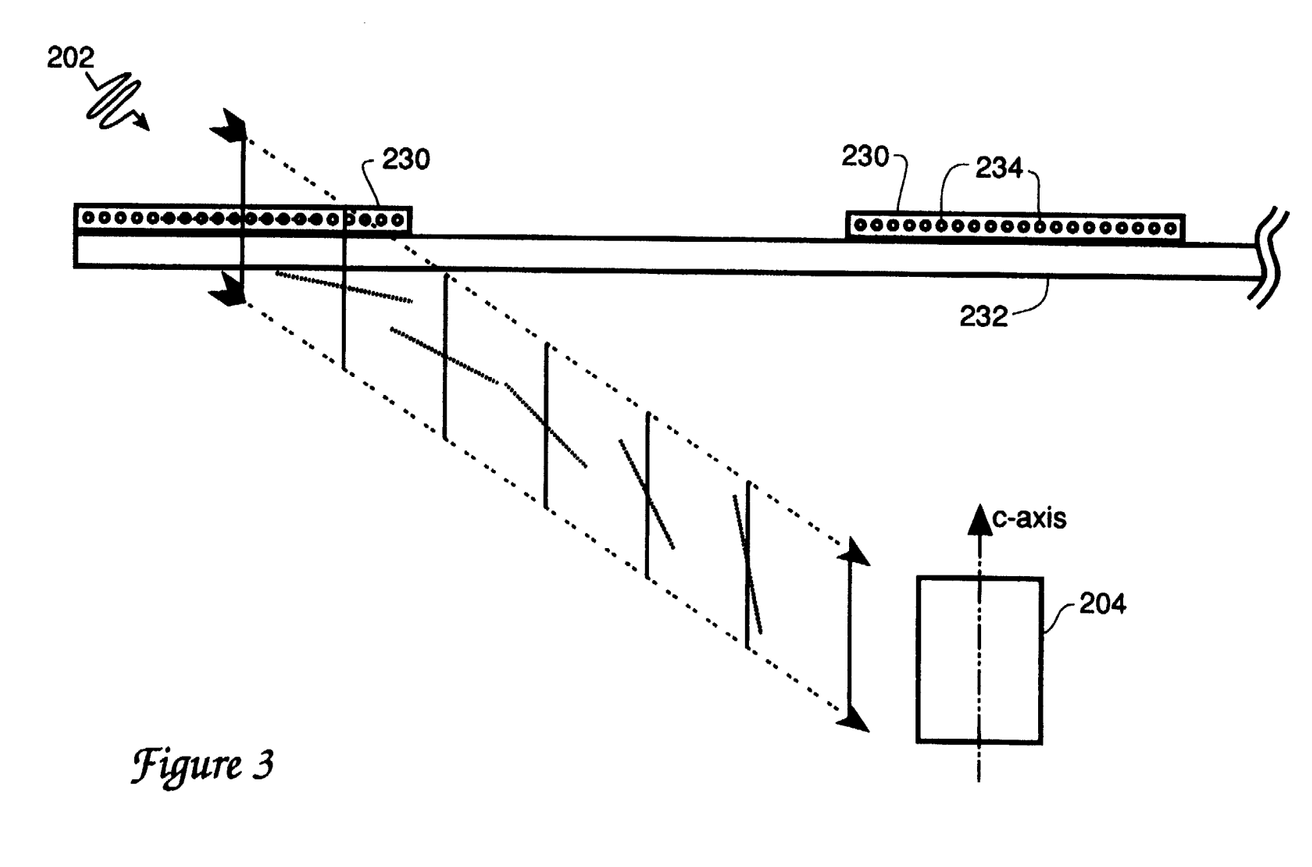
FIG. 3 is a front view of a laser super array used in the system of FIG. 2A and showing the effect of a polarization rotation.

Super array 202 includes 12 broad area lasers 230, two of which are shown in FIG. 3. These are spaced apart a distance about four times the length of their output faces and mounted on a heat sink 232. Each broad-area laser 230 is itself a linear array of high-gain regions 234 separated by low-gain regions. The low-gain regions are achieved by a spatially periodic implant that damages formerly high-gain regions. The illustrated broad area lasers have 20 high-gain regions 234, indicated by circles.

The output of super array 202 is a super beam composed of beams from each broad area laser 230. Each broad area laser beam is itself composed of 20 subbeams. The common linear polarization of the subbeams, beams and the super beam is aligned with the length of super array 202. Coherency along the super array is poor; normal to the super array, the subbeams and beams act like separate point source lasers so that coherency is maximal normal to the super array length. A beam is indicated as having originally orthogonal polarization and coherency axes. Due to the action of half-wave plate 208 (FIG. 2), the polarization axis rotates as progressively indicated in FIG. 3. When the beam reaches barium titanate crystal 204, the polarization axis is parallel with the coherency axis, which in turn is aligned with c axis of the crystal. This c axis is the conjugation axis for barium titanate.

The output of super array 202 is collimated by lens 206. The collimated beam then passes through half-wave plate 208 arranged to rotate polarization 90° while the orientation of the coherency axis remains unchanged. Lens 210 then focuses a portion of the super beam near the edge of prism 216, which is here used as a pick-off mirror. Spatial filter 214 sharpens the beam portion by blocking light that would otherwise reach prism 216 too far from its edge. Spatial filter 214 acts only on the outside of the beam, since the prism edge inherently "filters" out the light that misses the edge to the inside of the beam.

Prism 216 reflects the captured light 90° through lens 218 that serves to diffusely focus the beam on crystal 204. The light then is reflected by mirrors 222 and 224, detailed in FIG. 2B. The light then passes through cylindrical lens 226 which collapses the beam normal to the plane of FIG. 2A so that it fits within crystal 204.

A portion of the light entering crystal 204 is phase conjugated and so returns through the cavity optics back to super array 202. The diffuse focus established by lens 218 ensures crosstalk between subbeams and between beams so that the laser resonance modes lock onto each other.

Figure 4:
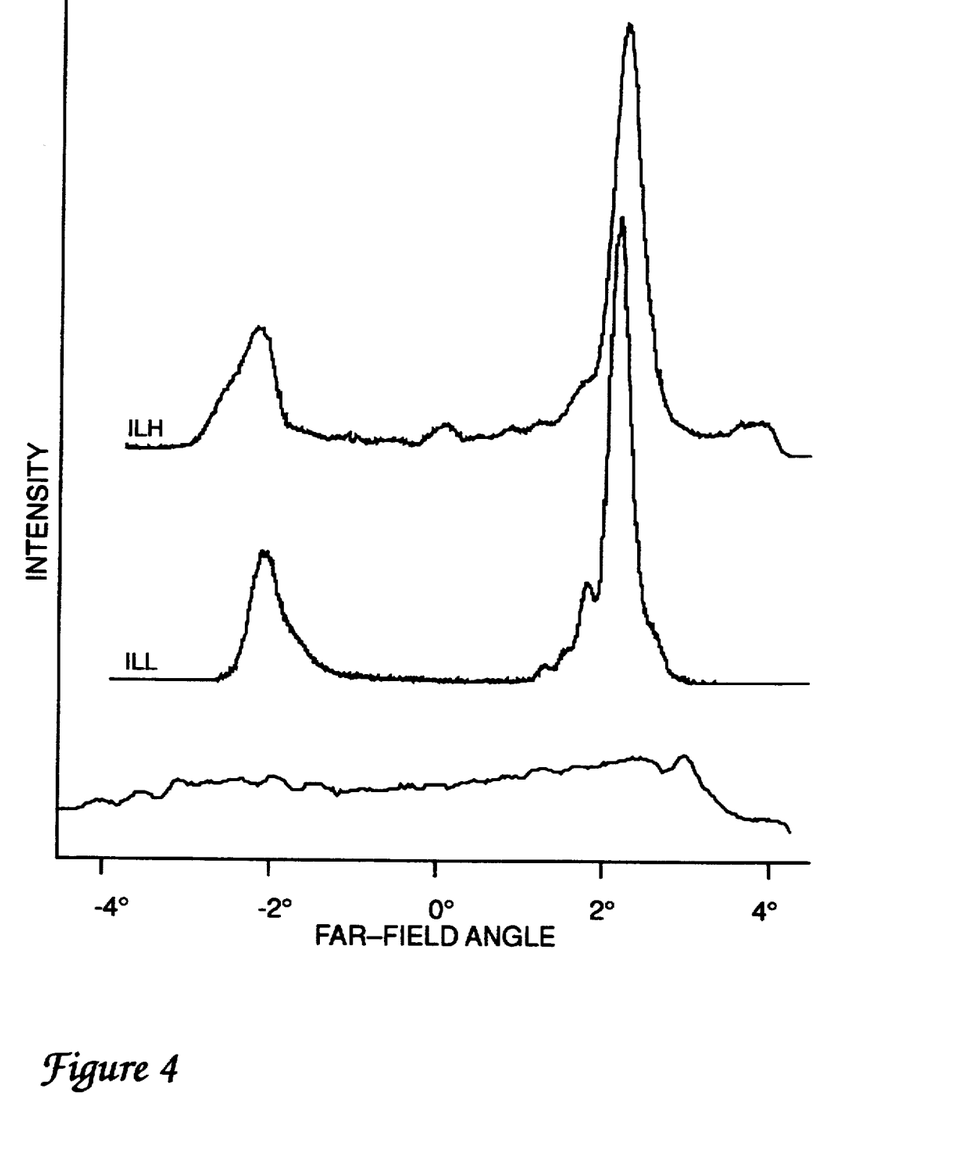
FIG. 4 is a graph showing a cross-sectional far-field beam profile of the laser super array of FIG. 3 with and without enhancement using the phase conjugator.

The effects of phase-conjugation on the laser output are shown in FIG. 4. The far-field free-running (FR) output intensity profile is shown by the bottom curve. Low and high-power injection locked outputs are illustrated by curves ILL and ILH respectively. The output of system 200 is taken along the large peaks at about 2°. The moderate peak at about −2° is fed to the barium titanate crystal. The large peak represents intense, highly-chromatic, and collimatable laser system output, in start contrast to the free-running super array output.

Figure 5:
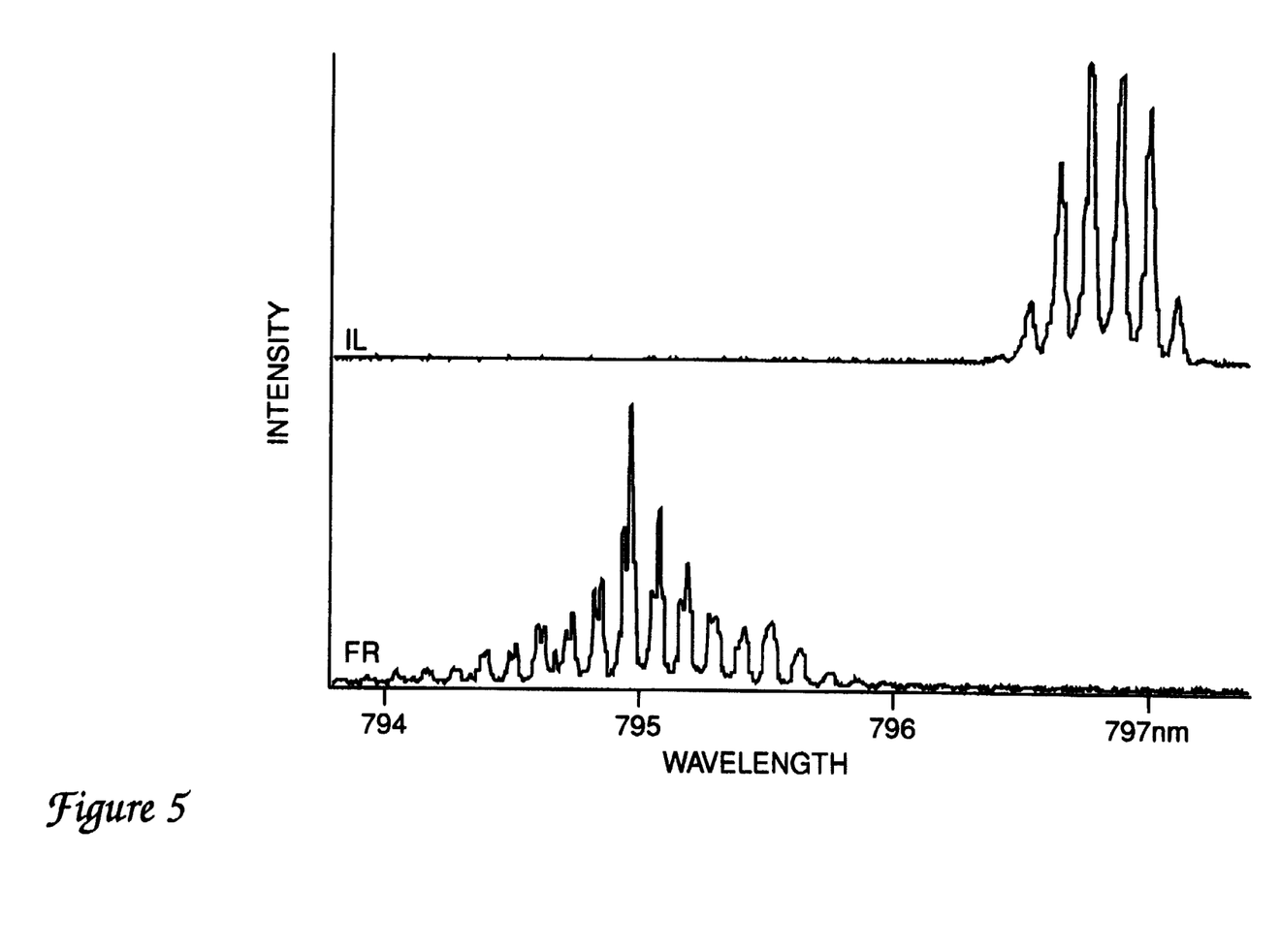
FIG. 5 is a frequency spectrum of the output of the laser super array of FIG. 3 with and without enhancement using the phase conjugator.

Effects of phase conjugation feedback are further indicated in the wavelength spectrum presented in FIG. 5. Injection-locked (IL) operation, represented by the upper curve, provides a narrower spectrum at a somewhat longer wavelength than does free-running (FR) operation, indicated by the lower curve.

Figure 6:
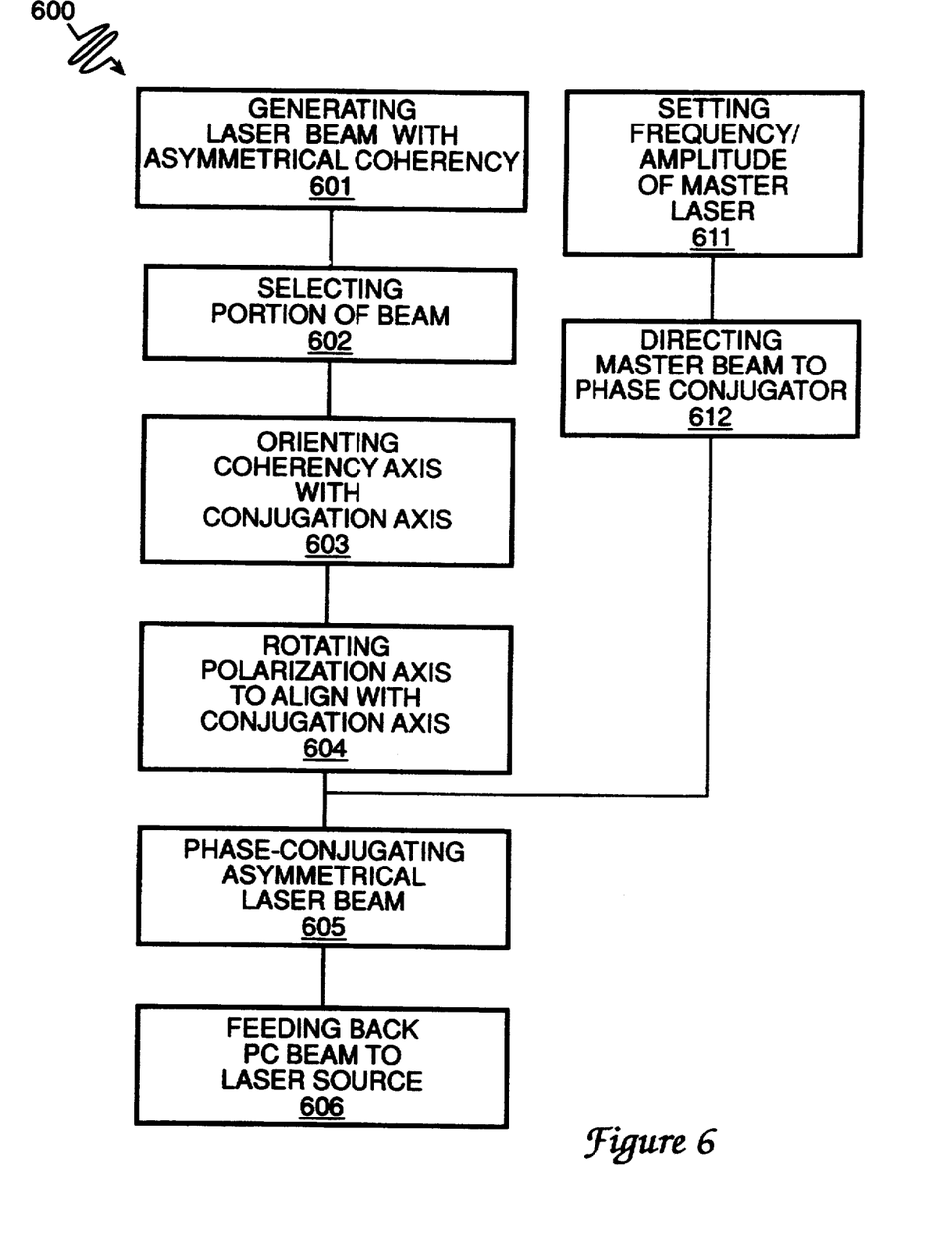
FIG. 6 is a flow chart of a method in accordance with the present invention.

A method 600 employed with system 200 is flow charted in FIG. 6. A laser beam is generated at step 601 having linear polarization and asymmetrical coherency, with the coherency axis aligned at least 45° from the polarization axis. A portion of the beam is selected at step 602 for phase conjugation. The coherency axis is oriented by cavity optics with the conjugation axis of the phase conjugator at step 603. The polarization axis is rotated at step 604 so that it is aligned with the coherency axis, and thus with the conjugation axis. The beam portion is phase conjugated at step 605. The phase conjugated portion is fed back to the laser source at step 606.

One of the advantages of system 200 over prior-art phase conjugator devices is that no external laser is required to drive the super array. On the other hand, the present invention does provide for a variation of method 600 in which a separate laser is used. Preferably, the frequency and amplitude of the master laser can be adjusted, as indicated in step 611. The beam from the master laser can then be directed, at step 612, to the phase conjugator, now operating in a dual-beam mode.

Figure 7:
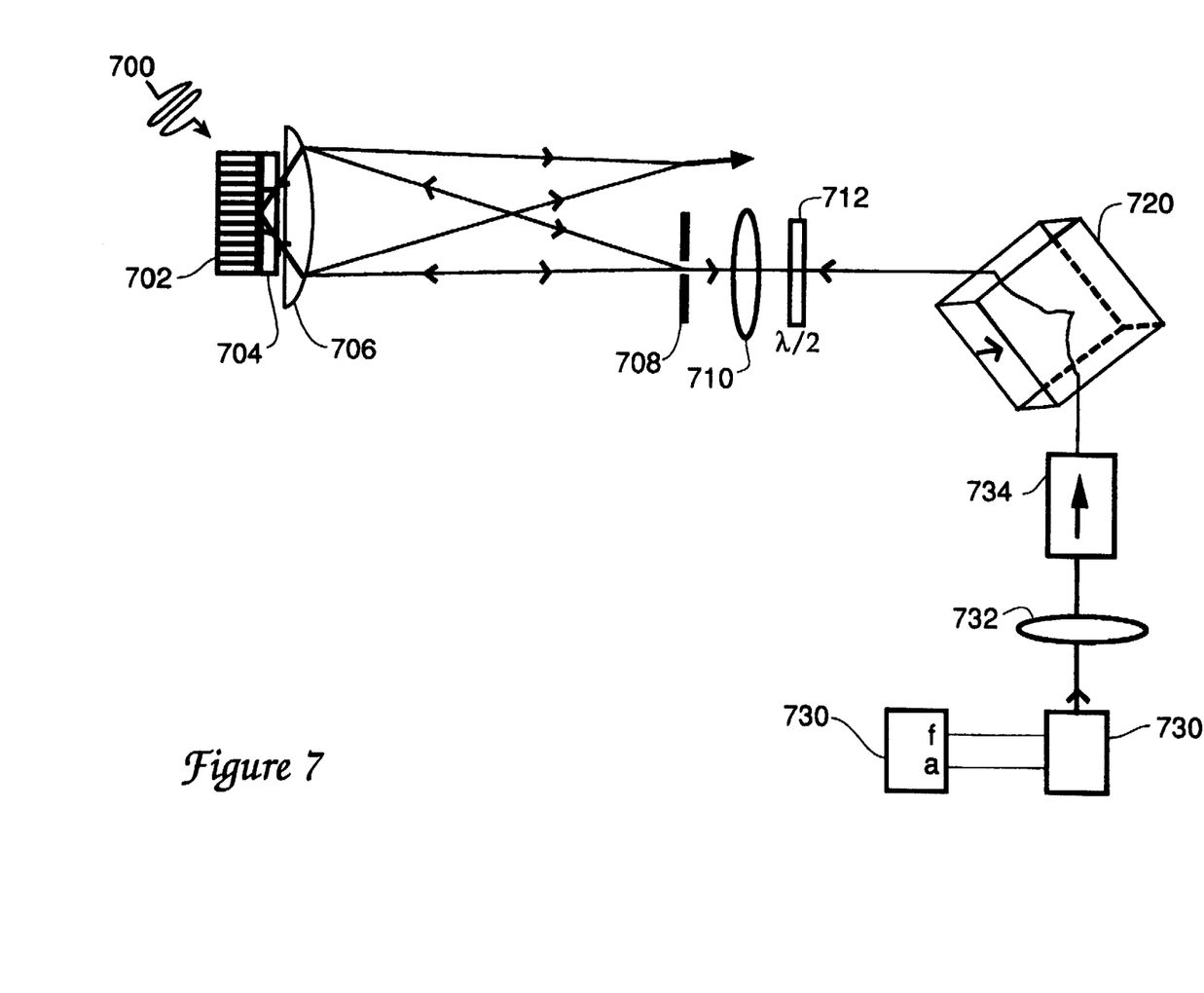
FIG. 7 is a schematic view of a dual-beam phase conjugating laser system in accordance with the present invention.
Figure 8:
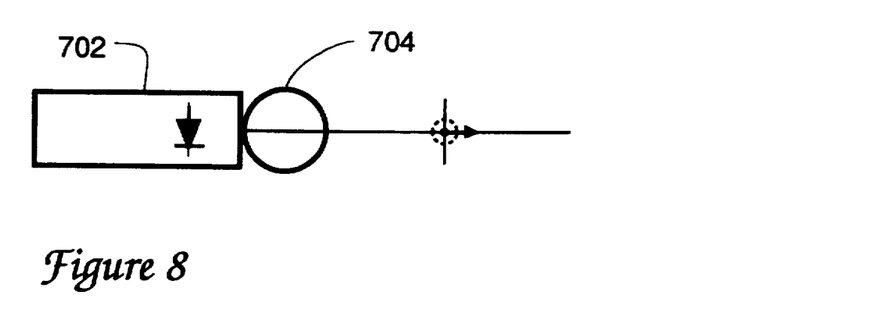
FIG. 8 is an end view of a laser super array and an optical fiber serving as a cylindrical lens of the system of FIG. 7.

This variation of method 600 is employed in a laser system 700 shown in FIG. 7. System 700 includes a super array 702 of broad area lasers. Conceptually part of the common cavity optics, an optical fiber 704 is mounted on the front of super array 702. Optical fiber 704 serves as a cylindrical lens, narrowing the super beam profile in the plane defined by the propagation vector and the coherency axis. Also included in the common optics is a focusing lens 706 that directs the feedback portion of the super beam through a slit 708, which serves as a spatial filter and entrance to the dedicated injector optics. The dedicated injector optics further include a lens 710 for focusing the filtered beam into a spot at barium titanate crystal 720. On the way, the filtered beam passes through a half-wave plate 712, which effects the 90° polarization rotation relative to the coherency vector. The feedback portion of the beam thus enters crystal 720 with polarization and coherency aligned with the c axis.

Figure 9:
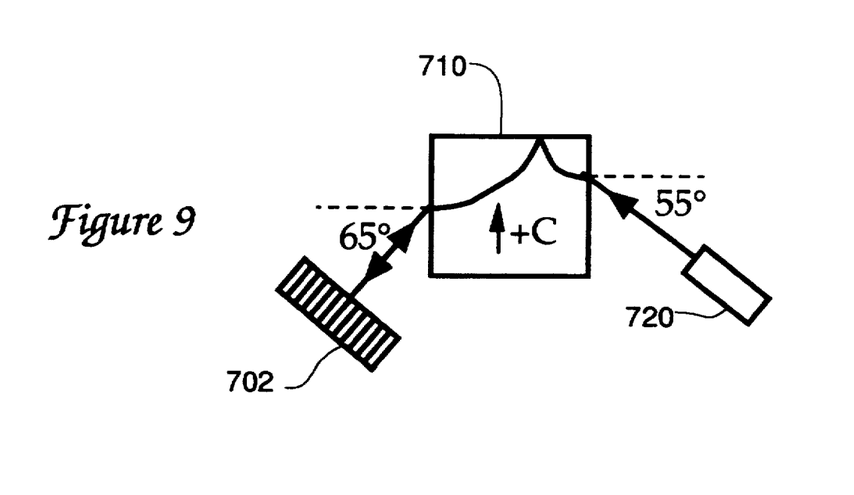
FIG. 9 is a schematic side view of a light path through a phase-conjugating crystal of the system of FIG. 7.

Concurrently, a relatively low-power single-mode laser 730 provides an output beam to the opposite side of crystal 720. On route, the single-mode beam is collected by lens 732 and passed through a Faraday isolator 734, serving as a one-way light valve. After passing through the Faraday isolator, the single-mode light enters crystal 720 with the proper polarization. Laser 730 provides symmetrical coherency, so there is no problem with coherency alignment. The single-mode beam, the super beam, and the photorefractive properties of the barium titanate interact so that the light fed back to super array 702 has its frequency and amplitude controlled by the single-mode beam. The interaction of the beams is best indicated in FIG. 9.

Super array 702 then provides a sidelobe that is, in effect, an amplified version of the single-mode laser output. Measurements indicate that the output of super array 702 matches the frequency of single-mode laser 730 to within 750 MHz resolution of the measuring apparatus.

Faraday isolator 734 ensures that the single-mode laser 730 controls super array 702, rather than the other way around. Light returning toward single-mode laser 730 is blocked by Faraday isolator 734. Thus, laser 730 runs unaffected by feedback from crystal 720. On the other hand, provision is made for a controller 736 to control the frequency and amplitude of single-mode laser, so that the frequency and output of system 700 can be controlled.

Figure 10:
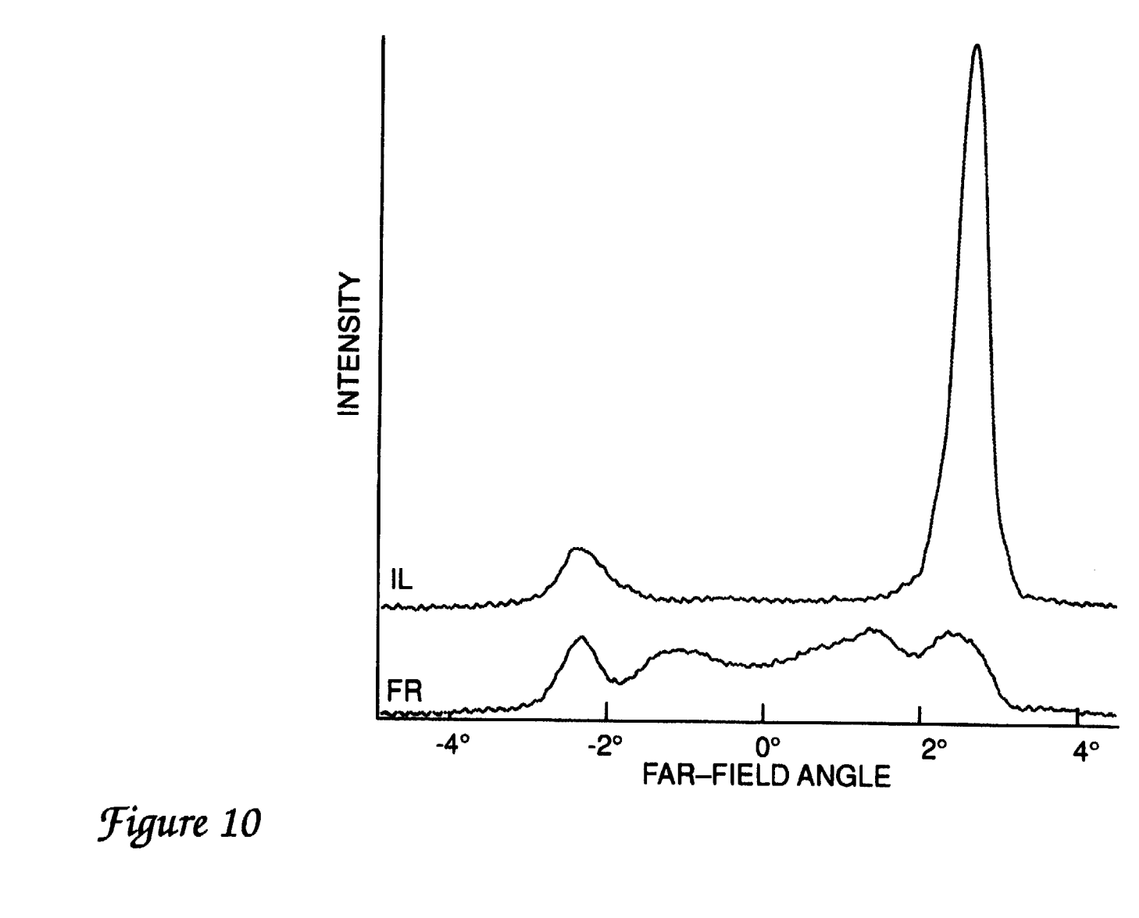
FIG. 10 is a graph contrasting the spatial distributions free-running and injection-locked outputs of a laser array of the system of FIG. 7.
Figure 11:
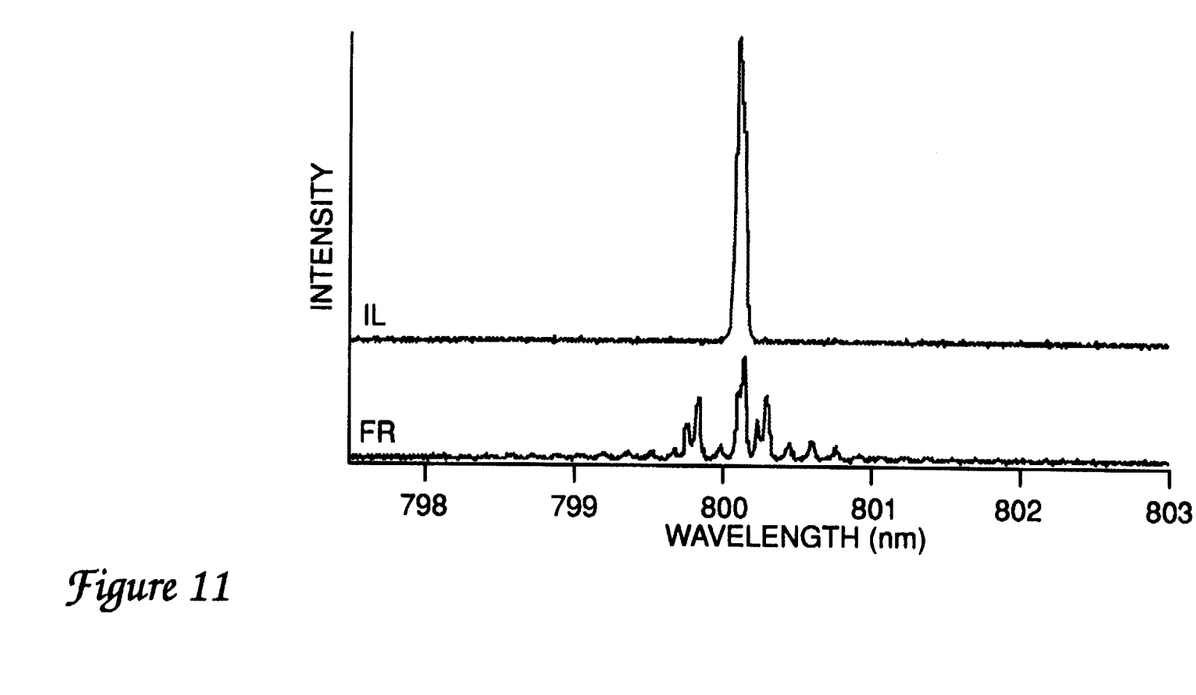
FIG. 11 is a graph contrasting the wavelength distributions of free-running and injection locked outputs of the laser array of FIG. 7.

The free-running (FR) and injection-locked (IL) modes of super array 702 are illustrated in FIG. 10. Again, the peak at 2° is used as the system output. The graph of FIG. 11 illustrates how much more monochromatic the injection locked mode is than the free-running mode of super array 702.

Further aspects of the invention are presented in the following text, lifted from two articles. The first article describes a system very similar to the single-beam laser system 200, while the second article describes a system very similar to the dual-beam laser system 700. Reference numerals have been added and changed to correlate with the figures.

Stuart MacCormack and Jack Feinberg have described a system essentially the same as system 200 in "High-Brightness output from a laser diode array coupled to a phase-conjugating mirror" *Optics Letters*, Vol. 18, No. 3, Feb. 1, 1993, pp. 211-213. The following text is from that article.

We obtain single-lobed, near diffraction limited output from a 20-element laser diode array coupled to an apertured, photorefractive phase conjugator. At low driving currents the output beam is diffraction limited and contains 75% of the total output power emanating from the array. At high driving current a 1.5×diffraction-limited lobe contains 490 mW of power, or 54% of the output power. By studying the near-field emission pattern and the frequency spectrum of the laser, we confirm that the apertured conjugator selects a narrow range of output array transverse modes.

Although laser diode arrays can produce impressive amounts of optical power, they usually simultaneously operate on many transverse modes, which makes their far-field pattern a mess. Their poor beam quality makes laser diode arrays ill suited for many applications, such as launching intense light into single-mode waveguides and pumping minilaser systems.

Here we couple a laser diode array to an external, photorefractive phase conjugator, and thereby force the array to operate on a single transverse mode. Even while running close to its maximum rated output power, this device now puts out a near diffraction-limited beam.

A number of external devices have been previously used to modify the far-field emission profile of laser diode arrays. Spatial filters within the external cavity can force the array to operate in its fundamental, "in-phase" transverse mode. Similarly, a mirror aligned to retroreflect one side of the output beam can enhance operation of a modified, high-order array transverse mode, although the resulting device is then extraordinarily sensitive to alignment, temperature, and output power. Optical phase conjugation is an ideal way to feed light back into a laser diode array, because the conjugator automatically returns the light to the high-gain region of the diode. A laser diode array coupled to an off-axis phase-conjugating mirror gave near diffraction-limited, single-lobed output in the far field. However, that system was not self-starting, requiring an external light source, and the stability and reflectivity of the phase conjugator limited the system's output power. In this paper, we describe a laser diode array plus phase conjugator that overcomes all of these problems.

FIG. 2A shows the optical set up. A 1 Watt, 20-stripe, laser diode array (Spectra Diode Labs 2461-P1 with no special coatings) is mounted on a heat sink to maintain the laser's temperature at 10° C. The array of lasers forms a line in the horizontal plane, and the laser's output is polarized along this line. The output of the array has poor spatial coherence along a line parallel to the array, but near perfect spatial coherence along a line perpendicular to the array.

The laser output is collected by an 8-mm focal length lens (N.A.=0.5) and passes through a half-wave plate, which rotates the polarization through 90° making the light's axes of coherence and polarization parallel. A prism positioned in the far-field plane (generated by the f=100 mm lens) picks off one half of the quasi-twin-lobed output beam. Two mirrors oriented at 45° to the plane of the table direct the light into a BaTiO$_3$ crystal. The two 45° mirrors rotate both the light's polarization and coherence axes by 90° into the horizontal plane. This arrangement of mirrors and waveplates ensures that the polarization and the coherence axes of the light lie in the plane defined by the BaTiO$_3$ crystal's c axis and the direction of the incident beam, which is necessary for the crystal to operate as a "CAT" conjugator. (An alternate and simpler arrangement is to eliminate the two 45° mirrors and instead rotate the crystal so that its c axis points out of the plane of the table.)

In FIG. 2A, a laser-diode array coupled to a self-pumped phase conjugator. The half-wave plate rotates the plane of polarization, and the two 45° mirrors align the coherence plane and the plane of polarization parallel to the BaTiO$_3$ crystal's c axis. The right-angled prism and the vertical razor edge R formed an adjustable aperture in the far-field. The angle of incidence of the signal beam on the crystal is $\theta = 60°$.

The chromium-doped BaTiO$_3$ crystal (named "CROW") measures 5.8 mm×5.2 mm×2.9 mm, with the c axis along the longest dimension, and operates as a self-pumped "CAT" conjugator. A spherical and cylindrical lens pair generate a 1.5 mm square beam at the crystal face. All of the transmission optics, excluding the prism, are anti-reflection coated at the laser wavelength. A razor edge and the vertical prism edge form a variable spatial filter in the far field. The frequency spectrum of the laser output is analyzed by a Spex 0.75-meter double grating spectrometer with a resolution of $\sim 0.01$ nm. We record either the near-field or the far-field beam profile by a 512-element linear photodiode array.

When we first switch on the laser, its output is that of a usual, free-running laser diode array: a poorly defined, twin-lobed, far-field pattern ($\sim 40$ times the diffraction limit of the 200 micrometer emitting region) having a broad frequency spectrum. After a short delay (typically 20 seconds), the phase conjugator turns on, and one of the far-field lobes grows at the expense of the other one. After an additional $\sim 50$ seconds the phase conjugate reflectivity attains its steady-state level, and the laser settles into single-lobed operation. With a drive current of 0.8 A (1.7 I$_{th}$), the angular width of this output lobe in the far field is 2.9 times the diffraction limit. Narrowing the width of the aperture then produces a diffraction-limited beam at this drive current, as shown in FIG. 4. Once the phase-conjugate mirror turns on, it can track in real time small changes in the laser's far field profile or in the aperture's position.

The most efficient operation of the external cavity always occurs for an emission angle centered close to 2.2°. For the case of high-power operation of the cavity, the prism and razor edges are positioned at far-field angles of $-1.98°$ and $-2.58°$. The array maintains single-lobe emission for all driving currents. The maximum driving current is 1.5 A (3.1 I$_{th}$), which produced a total array output power of 910 mW. We limit the driving current to 1.5A to avoid the possibility of intensity damage to the array facet. At high output powers the far-field lobe width gradually increases up to 1.48 times the diffraction limit at the maximum array drive current.

In addition, at high drive currents a larger fraction of the array output lies outside the locked array mode, and appears as a background intensity in the far field. These effects may be due by self focusing of the light in the laser gain medium, increased free-running mode competition, and the decreased phase-conjugate reflectivity (discussed below) which accompanies the higher laser drive currents. At the 1.5A maximum drive current, the main lobe contains 493 mW (of which 406 mW is contained in a Gaussian spike of width 1.48 times the diffraction limit).

The phase conjugate reflectivity of the "CAT" conjugator decreases from 35% at small driving currents, close to the lasing threshold, to 14% at the highest measured drive current. This, in conjunction with the increasing signal power, causes the power fed back to the laser from the conjugator to remain roughly constant at ~13 mW over the range of drive currents investigated. The total laser output is approximately 3% higher with the conjugator than without it at the same driving current.

The external cavity output exhibits surprising intensity stability (<0.5% fluctuations) over a time scale ranging from a few seconds to hours. The dynamic response of the phase-conjugate mirror compensates for gradual changes in the drive current, operating wavelength, or ambient temperature with no degradation in the single lobe profile. The dark-storage time of this particular $BaTiO_3$ crystal exceeds 12 hours, so that, once the phase conjugator turns on and establishes single-lobe laser emission, the conjugator will then turn on instantly the next day, and the laser immediately display a single mode output, even if the laser had been switched off overnight.

When the conjugator first turns on, it pulls the laser's output spectrum ~2 nm towards the red, and narrows the spectrum to a few longitudinal modes under a stable, 0.5 nm Gaussian envelope (FWHM), as seen in FIG. 5. This frequency width is close to the expected ~1 nm wavelength Bragg selectivity of the grating self-formed inside the "CAT" conjugator. As a comparison, we also tried replacing the phase-conjugate mirror with an ordinary high-reflectivity plane mirror, and adjusted the lens pair to form a focus at this mirror. With very careful (and finicky) alignment, at a drive current of 1A we were able to generate a near diffraction-limited far-field lobe containing 34% of the array output. However, this simple mirror was less successful at higher drive currents; at 1.5A the output lobe could not be narrowed below 1.75 times the diffraction limit, and the lobe contained only 25% of the array's total output.

FIG. 4 The array far-field pattern under free-running (FR) conditions, (b) with phase-conjugate external cavity feedback at a low drive current (1.7 $I_{th}$), and (c) with phase-conjugate feedback at the maximum drive current (3.1 $I_{th}$). The main lobe in trace ILL has a full-width, half-maximum of 0.317°, which corresponds to 1.09 times the diffraction limit (a Strehl ratio of 0.44). The trace ILH corresponds to an output power of 910 mW and the main lobe has a full-width, half-maximum of 0.43°, 1.48 times the diffraction limit (a Strehl ratio of 0.30).

FIG. 5 Frequency spectrum of the array output showing the longitudinal modes under free-running (FR) conditions, and with phase-conjugate external cavity feedback (IL). The conjugator shifts and narrows the frequency spectrum. Notice the absence of fine splitting in trace (IL), indicating that the laser is operating on one array mode (or perhaps a few adjacent modes).

In summary, we have presented a technique for obtaining stable, near diffraction-limited output from a high-power laser diode array. Because the laser emits only a small fraction of its output into the conjugator, we envision that the output power can be significantly increased without damaging the conjugator. The ability of the phase conjugator to feed light back to precisely the high-gain region of the laser should allow the extension of this technique to much larger arrays, or to more complicated, higher-power diode-laser structures, and this is the current direction of our investigations.

Stuart MacCormack, Jack Feinberg and M. H. Garett disclose a laser system essentially like that of system 700 in "Injection-locking a laser diode array with a phase-conjugate beam" to be published in Optics Letters, Accepted for publication October, 1993, 3 pages. The following text is adapted from that article.

We use a mutually-pumped phase conjugator to guide the output beam of a single-mode laser diode into the active region of a high-power laser-diode array. This injected beam locks the frequency of the array, causing it to emit a single, 1.45×diffraction-limited, continuous-wave output beam containing 85% of the array's total output power. Phase-conjugate injection dramatically improves the coupling into the laser array, so that less than a milliwatt of injected power is sufficient to lock all the array's 450 mW output to the frequency of the master laser.

Injecting light from a single-mode laser into a laser diode array can narrow the array's output spectrum and produce a nearly diffraction-limited output beam. Over a narrow range of wavelengths and injection angles, the laser array becomes a slave to the master laser's injecting beam; it simply becomes a waveguide with optical gain and amplifies the injected beam at the expense of the array's own free-running modes. However, this occurs only if the master laser beam's frequency, position, and incident angle are just right, and these constraints place great demands on the master laser beam's frequency stability, shape, and alignment. Here we demonstrate an injection-locking scheme that overcomes these problems; we use a mutually-pumped phase conjugator to aim the master laser beam precisely into the gain region of the laser array.

A mutually-pumped phase conjugator couples two optical beams and directs each beam down the throat of the other. The two incident light beams typically have slightly different frequencies and so are not coherent with each other. The conjugator transfers spatial and phase information from one beam to the other, so that the two beams exit the device as phase-conjugate replicas of each other. We use a photorefractive crystal of barium titanate as our mutually-pumped phase conjugator. The ~1 sec response time of this conjugator automatically adjusts to gradual changes in either the position or the angle of incidence of the two input beams. Using a mutually-pumped phase conjugator to direct the laser beams eases the problem of beam alignment and shape by a factor of ~1000, from one of microns and millidegrees into one of millimeters and degrees.

FIG. 7 shows our experimental set up. The slave laser is an off-the-shelf, 1-watt laser diode array (SDL 2462-P1) mounted on a temperature-controlled heat sink and operated at a wavelength of ~800 nm. We conservatively operate the laser at a current of 1.0 A (equal to 2.1 times the threshold current where it produces a continuous wave, free-running output power of 450 mW. (We operate the laser below its maximum rated output power to suppress oscillation on its free-running modes. Alternatively, we could reduce the slave laser's output coupler reflectivity and thereby increase the self-oscillation threshold.) A high-numerical-aperture lens collects the horizontally polarized output beam and directs it toward a cylindrical and spherical lens pair. This lens combination generates a pseudo-twin-lobed far-field pattern with a width of ~10 mm. One lobe is incident on an adjustable slit placed in the far field. Light transmitted through the slit is weakly focused by a spherical lens into a ~1 mm×1 mm spot on one a-face of the BaTiO$_3$ crystal. Its external angle of incidence is 65° to the crystal face normal. Our blue-colored BaTiO$_3$ crystal (named "BLEU") measures 6.1×6.6×5.9 mm, and is mounted with its c axis in the vertical plane. (Blue BaTiO$_3$ has an enhanced photorefractive response at near-infrared wavelengths compared with the usual pale-yellow BaTiO$_3$. We use a half-wave plate to make the array's output polarization parallel to its direction of spatial coherence, which is perpendicular to the plane of the laser gain region.

The master laser is a 100-mW, temperature-tuned, single-mode laser (SDL-5412-H1). We temperature tune this master laser's frequency to lie anywhere within the slave laser's 2-nm-wide, free-running output spectrum. Its polarized output is collected by a high numerical aperture lens and directed through a half-wave plate and Faraday isolator to make it an extraordinary ray at the barium titanate crystal. (The Faraday isolator prevents light from the slave laser from feeding back into the master laser and causing frequency instabilities. Good optical isolation is especially important here since a fraction of the array's output is converted into the phase-conjugate replica of the master laser's beam.) We direct ~8 mW of output from the master laser into the BaTiO$_3$ crystal face opposite to the a-face entered by the slave laser, and positioned closer to the crystal's positive c-face than to the slave laser's input beam. This injected beam makes an external angle of 55° to the crystal face normal. We use asymmetric beam positions because the narrow-frequency, master-laser beam fans more strongly in the crystal than does the broad-bandwidth, slave-laser beam. We perform beam power, frequency, and shape measurements on reflections from optical flats placed in the paths of the master and slave laser beams. We analyze the optical beams' frequencies using a Spex 0.75 m double grating spectrometer and a Newport SR-200 spectrum analyzer (finesse >10,000). We monitor the beams' shapes with a 512-element scanning linear photodiode array placed in the far-field.

Within a few seconds after the master and the slave laser beams illuminate the crystal, the beams bend and join to form an asymmetric "bird-wing" mutually-pumped phase conjugator. The conjugator directs the master laser beam into the phase-conjugate replica of the slave laser beam. This injected beam now has the same spatial and phase profile as one of the preferred transverse array modes of the free-running array, and so has the optimum angle and profile for injection locking the array. Once the array is injection locked, it switches to emit predominantly a single lobe that appears at an angle equal to but opposite that of the injected beam.

As shown in FIG. 10, this strong output lobe is accompanied by a weaker secondary lobe that continues to illuminate the bird-wing conjugator. These two lobes compete and reach a stable steady state. For example, if the power directed into the conjugator decreases as a result of greater locking efficiency, then the conjugator becomes less efficient. This decreases the power injected into the array, which in turn decreases the power directed into the output lobe, thereby restoring the equilibrium. We found that directing too much master-laser power into the conjugator (>30 mW) can make the injection locking too efficient, so that all the array's output suddenly switches into the output lobe at the expense of the secondary lobe. With no light now coming from the array to the conjugator, the conjugator turns off and locking ceases.

Once the array is injection locked, the angular width of the output lobe changes according to the width of the far-field aperture. We adjust this aperture to optimize the power in the array's output lobe while still keeping its divergence near the 0.29° diffraction limit of the array's 200 micrometer wide emitting region. For example, with the adjustable aperture set to produce an output beam divergence of 1.5 times the diffraction limit, the output beam has an elliptical Gaussian profile and contains 85% of the array's total output (384 mW). The remaining output power is in the secondary lobe, with practically no emission outside these two locked lobes. When locked, the angular position of the main lobe remains constant, even with small perturbations to the far-field aperture width, ambient temperature, or position of the master laser beam. The stability of the locked far-field lobe intensity is good. Over periods of hours, we measure peak-to-peak fluctuations of less than 10% in the main lobe intensity. These intensity fluctuations arise predominantly from the 20% fluctuations in the conjugator's transmissivity. We observe no steering of the far-field lobe with small changes in the master laser's drive current.

The free-running array lases on many longitudinal modes simultaneously. However, the injection-locked array operates only at the master laser's single wavelength. (Frequency pulling and changes in the far-field profile were previously observed for two arrays coupled by a mutually-pumped phase conjugator. No other output frequencies are present to within the 20 dB sensitivity of our spectrometer. FIG. 11 shows that the bandwidths of the master and slave laser outputs are identical to within the 750 MHz resolution of our spectrum analyzer. Overlapping the master and slave laser outputs on a CCD camera produces stable high-visibility interference fringes, implying that the two lasers are locked and coherent with each other. We have shown previously that the "bird-wing" conjugator performs well even with mutually coherent input beams. In our experiments, we observe no contribution to the light injected into the array from any back-scattering gratings in the BaTiO$_3$ crystal.

Consider the injection-locking process as the amplification of a signal beam in a Fabry-Perot amplifier. The small-signal gain, G, is then defined as the ratio of the power contained in the locked lobe to the injected power, when operating in the unsaturated regime. For conventional injection-locking geometries, G typically ranges from 19-23 dB. However, we are not operating in the unsaturated regime. As discussed above, increasing the power incident upon the crystal from the master laser does not necessarily increase the power injected into the array. Nevertheless, even when operating in a saturated regime we obtain a locked output of >380 mW for an injected signal of 0.50 mW, corresponding to a saturated gain of 29 dB. Below this injection level the spatial shape of the output lobe deteriorates.

In our experiments the small signal gain G is large because our injected signal is the phase-conjugate replica of one of the natural modes of the slave laser array.

Consequently, it is efficiently coupled into the slave laser waveguide and has an ideal overlap with the gain profile of the laser. This leads to efficient gain extraction and to saturation of the amplification even with small injected power. If we permit a somewhat degraded output beam shape and compute the locking efficiency using the total output power of the slave array (i.e., both the output and the secondary lobes), then we can boast of a frequency-locked output of 450 mW for an injected power of 0.27 mW, which corresponds to a gain of 32 dB.

At steady state our bird-wing conjugator typically transforms of each incident beam into a phase-conjugate replica of the other beam. For example, in the setup shown in FIG. 7, the power from the master laser incident upon the $BaTiO_3$ crystal was 8.2 mW, while the power deflected by the conjugator toward the slave laser was 0.50 mW, which gives a phase-conjugate transmission of 6%. A transmissivity as large as 35% has been observed for mutually-pumped phase conjugators in the near infrared, but we were unable to achieve such large values in our experiments.

We have shown that a phase-conjugate injection beam significantly improves the ease of alignment and the efficiency of locking a laser diode array. The ability of a small injected power to lock a laser array becomes important when locking higher-power laser diodes or when locking multiple laser arrays. In these cases, the success of injection locking will depend on the power available from the single-mode master laser. With conventional injection locking, the currently available 100-mW single-mode lasers could lock a maximum of ∼10 watts of slave laser output. However, with phase-conjugate injection locking, the same 100-mW laser has the potential for locking slave laser arrays of as much as 100 watts.

FIG. 7 shows the combination of a Faraday isolator and a half-wave plate isolates the single-mode master laser. The slit selects one lobe of the array slave laser. Both the master and slave laser beams enter the $BaTiO_3$ crystal and fan toward its top face. (The crystal's +c axis faces "up," normal to the plane of FIG. 7.) FIG. 9 shows a side view of the $BaTiO_3$ crystal and the "bird-wing" pattern made by the laser beams.

FIG. 10 shows the far-field spatial pattern of the laser array when free-running (FR), and when injection-locked (IL). The full-width-at-half-maximum of the main lobe in (b) is 0.38°, which is 1.45 times the diffraction limit (a Strehl ratio of 0.37). The total output power for each case is 450 mW. FIG. 11 shows the diode array frequency spectra measured with a 1.4 meter spectrometer while the laser array is free-running (FR) and injection-locked (IL).

In system 200, the half-wave plate polarization rotator is in the common optics and the cylindrical lens is in the conjugator optics. In system 700, this relationship is reversed. In other systems, both are in the common optics, and in still other systems, they are both in the conjugator optics. The major determinant is whether you want the system output to be converged or have its polarization rotated. The same consideration applies to other external cavity optical elements.

In system 700, the master element was discrete from the superarray. However, the invention provides for incorporating a single-mode laser along with broad-array lasers in a superarray. An integrated or discrete optical isolator could be used, if necessary, to isolate the single-mode laser from the broad-area lasers' output.

The present invention effectively enhances the outputs from individual broad-area lasers, linear arrays of lasers, and linear arrays of broad-area lasers. In alternative embodiments, the present invention enhances the output of two-dimensional arrays of lasers. More generally, the invention enhances the output of laser sources with outputs characterized by asymmetrical coherency, particularly wherein the axis of maximal coherency is from 45°–90° relative to a polarization axis.

In the preferred embodiment, a barium titanate crystal serves as the phase conjugator. Such a crystal is fabricated as known in the art to have a c axis, which functions as a conjugator axis. However, other fabrication methods and other phase conjugating materials are known. In addition, a phase conjugating element can be coupled to other optical elements to form a phase conjugating assembly with specific properties. For example, polarization preserving phase conjugators use polarization rotators and mirrors in addition to phase conjugating crystals to provide a phase conjugator that is not sensitive to polarization. In that case, the present invention provides for aligning a coherency axis with a conjugation axis without regard to rotating a polarization axis. The present invention can be used with many of these different materials and assemblies.

In the case of a phase conjugator where the conjugation axis is not aligned with a c axis, the coherency axis is aligned with the former, rather than the latter. In some cases, it may not be necessary or even desirable to align the polarization axis with the coherency axis to get the desired enhanced output. These and other modifications to and variations upon the preferred embodiments are provided for by the present invention, the scope of which is limited only by the following claims.

What is claimed is:

1. A laser system comprising:
   a laser source for providing light having a propagation vector, a polarization axis, and a coherency axis, said light being propagated along said propagation vector, said light being polarized along said polarization axis, said light having maximum coherency along said coherency axis, said polarization axis and said coherency axis being generally orthogonal to said propagation vector, said coherency axis and said polarization axis having a discrepancy angle of at least 45° therebetween;
   a phase conjugator having a conjugation axis; and
   external cavity optics optically coupling a portion of the output of said laser source to said phase conjugator so that said coherency axis is substantially aligned with said conjugation axis.

2. A laser system as recited in claim 1 wherein said optics includes a polarization rotator for rotating said polarization axis so that said discrepancy angle is reduced and so that said polarization axis is substantially aligned with said conjugation axis.

3. A laser system as recited in claim 2 wherein said laser source is a linear array of semiconductor lasers.

4. A laser system as recited in claim 2 wherein said phase conjugator includes a $BaTiO_3$ crystal and wherein said conjugation axis is the c axis of that crystal.

5. A laser system as recited in claim 2 wherein said optics include a cylindrical lens arranged to narrow the cross section subtended by said light in the plane defined by said propagation vector and said coherency axis.

6. A laser system as recited in claim 2 wherein said phase conjugator operates in a single-beam mode.

7. A laser system as recited in claim 2 wherein said phase conjugator operates in a dual-beam mode.

8. A laser system as recited in claim 7 wherein a single-mode semiconductor laser provides a second beam for said dual-beam mode.

9. A laser system as recited in claim 8 further comprising means for controlling the amplitude of said single-mode semiconductor laser so as to affect the amplitude of the output of said laser system.

10. A laser system as recited in claim 8 further comprising means for controlling the frequency of said single-mode semiconductor laser so as to affect the frequency of the output of said laser system.

11. A method of providing a laser output, said method comprising the steps of:

generating a laser beam having a coherency axis and a polarization axis defining a discrepancy angle therebeteween of at least 45°;

optically guiding a portion of said beam to a phase conjugator having a conjugation axis so that said coherency axis is substantially aligned with said conjugation axis;

phase conjugating said portion of said beam; and directing the phase conjugated beam back to the source of said laser beam.

12. A method as recited in claim 11 wherein said guiding step further involves rotating said polarization axis relative to said coherency axis so that said polarization axis is substantially aligned with said conjugation axis.

13. A method as recited in claim 12 wherein said laser source is a linear array of semiconductor lasers.

14. A method as recited in claim 12 wherein said phase conjugator includes a $BaTiO_3$ crystal and wherein said conjugation is the c axis of that crystal.

15. A method as recited in claim 12 wherein said phase conjugating operates in a single-beam mode.

16. A method as recited in claim 12 wherein said phase conjugating operates in a dual-beam mode.

17. A method as recited in claim 16 wherein a second beam for said dual-mode operation is provided by a single mode laser.

18. A method as recited in claim 17 further comprising a step of adjusting the amplitude of said single-mode laser so as to increase the amplitude of the output of said laser system.

19. A method as recited in claim 17 further comprising a step of adjusting the amplitude of said single-mode laser so as to control the frequency of the output of said laser system.

* * * * *